(12) United States Patent
Ueda et al.

(10) Patent No.: US 6,887,770 B2
(45) Date of Patent: May 3, 2005

(54) METHOD FOR FABRICATING SEMICONDUCTOR DEVICE

(75) Inventors: Tetsuzo Ueda, Osaka (JP); Masahiro Ishida, Osaka (JP); Masaaki Yuri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 40 days.

(21) Appl. No.: 10/442,301

(22) Filed: May 21, 2003

(65) Prior Publication Data

US 2004/0110395 A1 Jun. 10, 2004

(30) Foreign Application Priority Data

May 23, 2002 (JP) ....................... 2002-149513

(51) Int. Cl.[7] .................. H01L 21/30; H01L 21/46
(52) U.S. Cl. ............... 438/455; 438/458; 438/459; 438/478; 438/479
(58) Field of Search ............... 438/455, 459, 438/478, 479, 458, 662, 795, 780, 674

(56) References Cited

U.S. PATENT DOCUMENTS

| | | | | |
|---|---|---|---|---|
| 5,126,921 A | * | 6/1992 | Fujishima et al. | 361/525 |
| 6,372,608 B1 | * | 4/2002 | Shimoda et al. | 438/455 |
| 6,410,368 B1 | * | 6/2002 | Kawasaki et al. | 438/145 |
| 6,521,511 B1 | * | 2/2003 | Inoue et al. | 438/458 |
| 6,645,830 B2 | * | 11/2003 | Shimoda et al. | 438/455 |
| 2002/0146893 A1 | * | 10/2002 | Shimoda et al. | 438/458 |

OTHER PUBLICATIONS

Michael K. Kelly et al., "Large Free–Standing GaN Substrates by Hydride Vapor Phase Epitaxy and Laser–Induced Liftoff", Japanese Journal of Applied Physics, vol. 38, Mar. 1, 1999, pp. L217–L219.

W.S. Wong et al., "Damage–Free Separation of GaN Thin Films from Sapphire Substrates", Applied Physics Letters, vol. 72, Feb. 2, 1998, pp. 599–601.

W.S. Wong et al., "INxGa$_{13}$Light Emitting Diodes on Si Substrates Fabricated by Pd–In Metal Bonding and Laser LiftOff", Applied Physics, vol. 77, No. 18, Oct. 30, 2000, pp. 2822–2824.

W.S. Wong et al., "Continuous–Wave InGaN MQW Laser Diodes on Copper and Diamond Substrates", Compound Semiconductor, vol. 7, Mar. 2001, pp. 47–49.

* cited by examiner

*Primary Examiner*—David Zarneke
*Assistant Examiner*—Thanh Y. Tran
(74) *Attorney, Agent, or Firm*—McDermott Will & Emery LLP

(57) ABSTRACT

A polymer film including an adhesive layer, which can be peeled off with heat, is bonded to the upper surface of a semiconductor layer. Then, a KrF excimer laser light beam is applied to a surface of a substrate opposite to the semiconductor layer. This causes local heating at the laser spot, so that the bonding of atoms is cut off at the interface between the semiconductor layer and the substrate, thereby forming a thermal decomposition layer between the substrate and the semiconductor layer. Subsequently, the substrate is heated at a given temperature, so that the adhesive layer foams to lose its adhesive power. As a result, the polymer film is easily peeled off from the semiconductor layer.

46 Claims, 8 Drawing Sheets

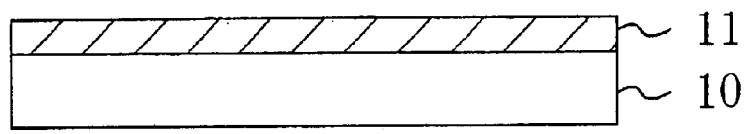
FIG. 1A
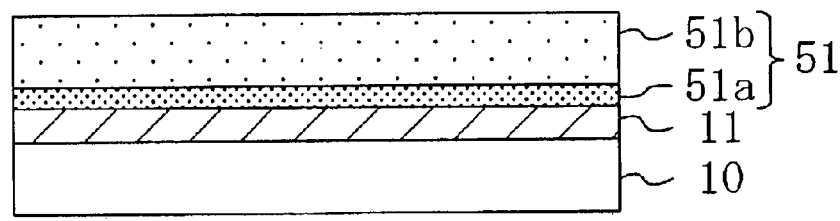
FIG. 1B
FIG. 1C
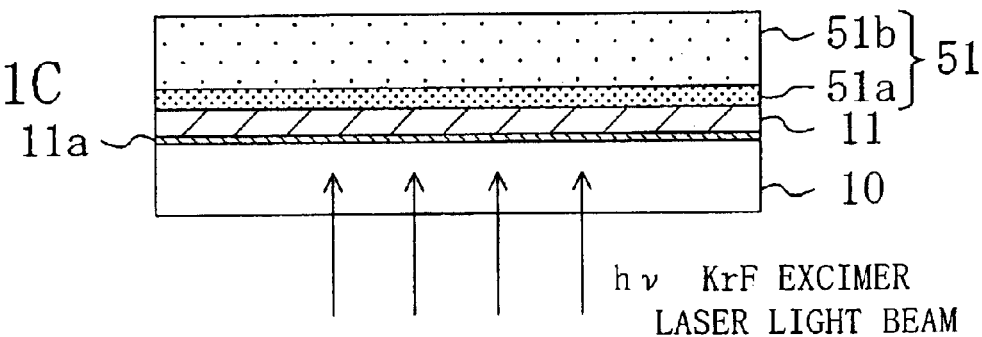
FIG. 1D
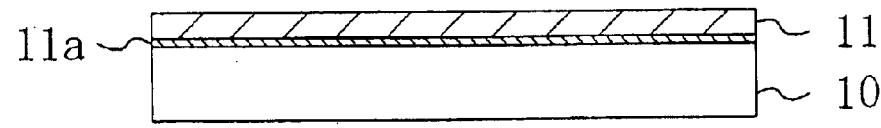

hν KrF EXCIMER LASER LIGHT BEAM

KrF EXCIMER LASER LIGHT BEAM hν   KrF EXCIMER LASER LIGHT BEAM.

METHOD FOR FABRICATING SEMICONDUCTOR DEVICE

BACKGROUND OF THE INVENTION

The present invention relates to methods for fabricating semiconductor devices such as light-emitting diodes or semiconductor lasers.

Group III-V nitride semiconductors (InGaAlN) containing gallium nitride (GaN) as a main component have wide bandgaps, and thus are applicable to light-emitting devices such as visible-light-emitting diodes which emit blue or green light or short-wavelength semiconductor lasers. In particular, light-emitting diodes have been put into practical use for large-screen displays or traffic lights. White-light-emitting diodes which emit light by exciting fluorescent materials are expected to replace currently-used lighting units.

Semiconductor lasers are also expected to enter mass volume production in the near future for implementation of high-density high-capacity optical disk apparatus using violet-light emitting lasers.

In the past, crystal growth of a nitride semiconductor has been difficult as other wide-bandgap semiconductors. However, techniques for crystal growth, which are metal organic chemical vapor deposition (MOCVD) processes in most cases, have been greatly developed, so that the above-mentioned diodes have been put into practical use.

A substrate for epitaxial growth of the nitride semiconductor is difficult to form using gallium nitride, and crystal growth on a substrate made of the same material as that of an epitaxial growth layer, as used for crystal growth of a semiconductor crystal such as silicon (Si) or gallium arsenide (GaAs), is not easily performed. Therefore, hetero-epitaxial growth performed on a substrate made of a material other than the nitride semiconductor is generally used.

Until now, sapphire has been most widely used for the hetero-epitaxial growth of a nitride semiconductor and exhibits the most excellent device characteristics. However, since sapphire has an insulating property, if a light-emitting diode including a pn junction, for example, is formed on a sapphire substrate, a substrate-side surface of a nitride semiconductor layer constituting the pn junction needs to be exposed by etching so that p- and n-side electrodes are formed on an epitaxial-layer-side surface of the substrate. As a result, the chip area increases as well as the series resistance increases.

In addition, sapphire has low heat conductivity. Thus, if a semiconductor laser, for example, is formed on a sapphire substrate, heat radiation from the laser deteriorates, thus shortening the lifetime of the laser.

One of the methods for solving the problems is using a conductive substrate superior to a sapphire substrate in heat radiation characteristic, as a substrate on which a nitride semiconductor is grown, instead of a sapphire substrate. Crystal growths using a silicon (Si) or gallium arsenide (GaAs) substrate have been vigorously researched and developed up to now, but no material superior to sapphire in crystallinity has been achieved.

In view of this, a so-called transfer method with which an epitaxial semiconductor layer of nitride grown on a sapphire substrate and having excellent crystallinity is separated from the sapphire substrate and then is transferred onto a substrate (i.e., different-type substrate) as an alternative to a sapphire substrate has been studied.

To separate the sapphire substrate from the epitaxial semiconductor layer, it is possible to remove the sapphire substrate by polishing. However, there also occur other problems that it is difficult to control the polishing of the sapphire substrate and that the sapphire substrate on which the nitride semiconductor has been grown is warped to be in a convex shape because of the difference in thermal expansion coefficient between nitride semiconductor and sapphire. To eliminate these problems, a laser lift-off technique, i.e., a technique for separating a sapphire substrate, has been developed (in Japanese Journal of Applied Physics, Vol. 38 (1999) pp. L217–L219 by M. K. Kelly et al. and Applied Physics Letters, Vol. 72 (1998) pp599–601 by W. S. Wong et al.). Specifically, after the nitride semiconductor layer has been grown on the sapphire substrate, the nitride semiconductor layer and the sapphire substrate are irradiated with a KrF excimer laser light beam with a wavelength of 248 nm or a YAG laser third-harmonic light beam with a wavelength of 355 nm. Each of the laser light beams is a short-pulse laser light beam with very high optical power and passes through the sapphire substrate to be absorbed only in the nitride semiconductor layer. This light absorption causes part of the nitride semiconductor layer near the interface between the nitride semiconductor layer and the substrate to generate heat locally, so that decomposition by heat occurs if the output of the laser light beam is sufficiently high. As a result, a decomposition layer containing metal gallium (Ga) created by the decomposition by heat is formed at the interface between the nitride semiconductor layer and the sapphire substrate. Accordingly, if the decomposition layer is removed either by heating to a temperature almost greater than the melting point of Ga or by using an acid solution, the nitride semiconductor layer is separated from the sapphire substrate.

However, since a nitride semiconductor layer for use in a light-emitting device has a thickness of as small as about 5 $\mu$m to 10 $\mu$m, handling of the nitride semiconductor layer (wafer) from which the sapphire substrate has been separated is extremely difficult.

Thus, to ease the handling of the wafer from which the substrate has been separated, shown was a first method with which a different-type substrate of, for example, silicon is bonded to a surface of the nitride semiconductor layer opposite to the sapphire substrate, and then the sapphire substrate is separated by a laser lift-off process so that the nitride semiconductor layer is transferred onto the different-type substrate (in Applied Physics Letters, Vol. 77 (2000) pp. 2822–2824 by W. S. Wong et al.).

As a second method, the following method was disclosed. A supporting substrate of, for example, silicon, is bonded to a surface of the nitride semiconductor layer opposite to the sapphire substrate via an organic adhesive interposed therebetween, and then the sapphire substrate is separated from the nitride semiconductor layer by a laser lift-off process. Subsequently, after the nitride semiconductor layer has been bonded to a different-type substrate of, for example, copper (Cu), the organic adhesive is removed, so that the supporting substrate is separated from the nitride semiconductor layer, thereby transferring the nitride semiconductor layer onto the different-type substrate (in Compound Semiconductor Vol. 7, (2001) pp47–49 by W. S. Wong et al.).

With the first or second method, the sapphire substrate is removed and the nitride semiconductor layer is transferred onto a conductive different-type substrate replacing the sapphire substrate. In this way, the p- and n-side electrodes can be formed so as to oppose to each other with the different-type substrate sandwiched therebetween. As a result, the chip size and the series resistance can be reduced. In addition, the heat radiation characteristic improves, thus allowing improvement in performance of the device.

However, with the first known method, while the temperature is reduced to room temperature after the epitaxial growth of the nitride semiconductor layer on the sapphire substrate, the substrate is warped to be in a convex shape because of the thermal expansion coefficient between sapphire and nitride semiconductor. Therefore, there occurs a problem that it is extremely difficult to bond the different-type substrate of silicon to the nitride semiconductor layer uniformly in a relatively large area.

The second known method also has a problem that it is difficult to completely remove the organic adhesive used for bonding the supporting substrate to the nitride semiconductor layer.

SUMMARY OF THE INVENTION

It is therefore an object of the present invention to allow a uniform bonding of a semiconductor layer grown on a substrate to other member such as a different-type substrate even if the semiconductor layer has a relatively large surface area. Another object of the present invention is ensuring the transfer of the semiconductor layer to the different-type substrate.

In order to achieve these objects, the present invention provides a structure in which a polymer film is bonded to the semiconductor layer grown on the substrate.

Specifically, a first inventive method for fabricating a semiconductor device includes: a) growing a first semiconductor layer on a first substrate; b) bonding an adhesive surface of a polymer film including an adhesive layer, which can be peeled off with heat, to an upper surface of the first semiconductor layer; c) applying irradiating light having a wavelength at which the light passes through the first substrate and is absorbed in the first semiconductor layer, to a surface of the first substrate opposite to the first semiconductor layer, thereby forming a thermal decomposition layer between the first semiconductor layer and the first substrate as a result of thermal decomposition of the first semiconductor layer; and d) heating the first substrate to lower the adhesive power of the adhesive layer, thereby peeling off the polymer film from the first semiconductor layer.

With the first method for fabricating a semiconductor device, even if the first semiconductor layer is warped to be in a convex or concave shape, the polymer film can be bonded to the first semiconductor layer uniformly in large area because the polymer film generally has an excellent formability. In addition, since the polymer film includes an adhesive layer which can be peeled off with heat, only heating is needed to peel off the polymer film, and no organic adhesive remains on the first semiconductor layer. Further, a thermal decomposition layer is formed between the first semiconductor layer and the first substrate as a result of thermal decomposition of the first semiconductor layer by applying irradiating light having a wavelength at which the light penetrates through the first substrate and is absorbed in the first semiconductor layer, so that the bonding of atoms is cut off between the first semiconductor layer and the first substrate. Accordingly, if a second semiconductor layer is regrown using the first semiconductor layer as an underlying layer, the crystal growth of the second semiconductor is not affected by a crystal lattice in the substrate, thereby improving the crystallinity of the second semiconductor layer. Moreover, the first and second semiconductor layers can be separated only by selectively removing the thermal decomposition layer, resulting in that the first and second semiconductor layers can be easily transferred onto the different-type substrate.

In the first method, the polymer film is preferably made of polyester.

A second inventive method for fabricating a semiconductor device includes the steps of: a) growing a first semiconductor layer on a first substrate; b) forming a sacrificial film on the first semiconductor layer, and then bonding an adhesive surface of a polymer film including an adhesive layer, to an upper surface of the sacrificial film; c) applying irradiating light having a wavelength at which the light passes through the first substrate and is absorbed in the first semiconductor layer, to a surface of the first substrate opposite to the first semiconductor layer, thereby forming a thermal decomposition layer between the first semiconductor layer and the first substrate as a result of thermal decomposition of the first semiconductor layer; and d) selectively removing the sacrificial film, thereby peeling off the polymer film from the first semiconductor layer.

With the second inventive method for fabricating a semiconductor device, the same advantages as those of the first method can be obtained. In addition, even if the polymer film does not include an adhesive layer which can be peeled off with heat, no adhesive remains on the first semiconductor layer when the polymer film is peeled off from the first semiconductor layer because the sacrificial film which can be selectively removed is interposed between the first semiconductor layer and the polymer film.

In the second method, the polymer film is preferably made of polyimide.

In the second method, the sacrificial film is preferably either a single-layer film made of a material selected from the group consisting of silicon oxide, silicon nitride and zinc oxide, or a multi-layer film containing at least two of these materials.

In the second method, in the step d), the sacrificial film is preferably dissolved with an acid solution.

In the first or second method, the first semiconductor layer preferably includes an active layer. In such a case, the active layer is, for example, a light-emitting layer in a light-emitting diode or a semiconductor laser, or a layer in which carriers flow in an electric device.

The first or second method preferably includes, between the steps c) and d), the steps of: e) selectively removing the thermal decomposition layer, thereby separating the first substrate from the first semiconductor layer; and f) bonding a second substrate made of a material different from that of the first substrate, to a surface of the first semiconductor layer from which the first substrate has been separated.

In such a case, the step f) preferably includes the step of interposing a metal film between the second substrate and the first semiconductor layer.

In such a case, the metal film preferably contains indium or tin.

The first or second method preferably includes the step g) of cleaving the second substrate and the first semiconductor layer using a plane in the second substrate along which cleavage is performed easily, after the step f) has been performed.

The first or second method preferably further includes the step h) of growing a second semiconductor layer on the first semiconductor layer, after the step d) has been performed.

In such a case, the second semiconductor layer preferably includes an active layer.

The first or second method preferably includes the steps of: i) selectively removing the thermal decomposition layer, thereby separating the first substrate from the first semiconductor layer; and j) bonding a second substrate made of a material different from that of the first substrate, to a surface of the first semiconductor layer from which the first substrate has been separated, after the step h) has been performed.

In such a case, the step j) preferably includes the step of interposing a metal film between the second substrate and the first semiconductor layer.

In such a case, the metal film preferably contains indium or tin.

The first or second method preferably includes the step k) of cleaving the second substrate, the first semiconductor layer and the second semiconductor layer using a plane in the second substrate along which cleavage is performed easily, after the step j) has been performed.

In the first or second method, the second substrate is preferably made of a material selected from the group consisting of silicon, gallium arsenide, gallium phosphide, indium phosphide, silicon carbide and metal.

In the first or second method, the first semiconductor layer is preferably made of a compound semiconductor containing nitrogen.

In the first or second method, the second semiconductor layer is preferably made of a compound semiconductor containing nitrogen.

In the first or second method, the first substrate is preferably made of a material selected from the group consisting of sapphire, magnesium oxide and lithium gallium aluminum oxide ($LiGa_xAl_{1-x}O_2$ where $0 \leq x \leq 1$).

In the first or second method, the irradiating light is preferably a pulsing laser light beam.

In the first or second method, the irradiating light is preferably an emission line of a mercury lamp.

In the first or second method, the irradiating light is preferably applied such that the first substrate is scanned within the surface area of the first substrate.

In the first or second method, the irradiating light is preferably applied while the first substrate is heated.

In such a case, the first substrate is preferably heated at a temperature at which the polymer film or the adhesive layer does not change in quality.

BRIEF DESCRIPTION OF THE DRAWINGS

FIGS. 1A through 1D are cross-sectional views showing structures in respective process steps of a method for fabricating a semiconductor device according to a first embodiment of the present invention.

DESCRIPTION OF THE PREFERRED EMBODIMENTS

Embodiment 1

Figure 2A:
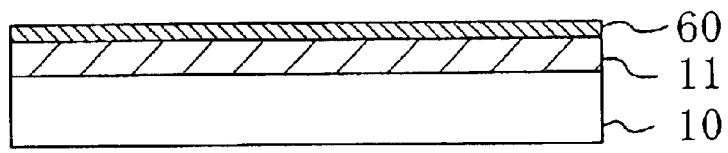
FIGS. 2A through 2D are cross-sectional views showing structures in respective process steps of a method for fabricating a semiconductor device according to a second embodiment of the present invention.

A first embodiment of the present invention will be described with reference to the drawings.

FIGS. 1A through 1D show cross-sectional structures in the order of procedure of a method for fabricating a semiconductor device according to the first embodiment.

The first embodiment is a method for producing a semiconductor layer (wafer) with a substrate for use in a semiconductor device such as a light-emitting diode.

First, as shown in FIG. 1A, a nitride semiconductor layer, i.e., a semiconductor layer 11 of $In_xGa_yAl_{1-x-y}N$ (where $0 \leq x$, $y \leq 1$ and $0 \leq x+y \leq 1$), is grown by, for example, a metal organic chemical vapor deposition (MOCVD) process to a thickness of about 3 μm on a sapphire substrate (wafer) 10 at a growth temperature of about 1000° C. In this case, in order to make the crystallinity of the semiconductor layer 11 excellent, the semiconductor layer 11 may be grown after a so-called low-temperature buffer layer (not shown) of aluminum nitride (AlN) or gallium nitride (GaN) has been grown to a thickness of about 50 nm at a growth temperature of about 500° C.

Next, as shown in FIG. 1B, a polymer film 51 including an adhesive layer 51a, which is changeable in property with heat and can be easily peeled off, is bonded to the upper surface of the semiconductor layer 11. The polymer film 51 includes a base material 51b of polyester. The adhesive layer 51a has been formed such that the adhesive layer 51a foams when heated at about 170° C. to reduce its adhesive area, thus losing its adhesive power.

Then, as shown in FIG. 1C, a krypton fluoride (KrF) excimer laser light beam having a pulsing wavelength of 248 nm is applied to a surface of the substrate 10 opposite to the semiconductor layer 11 such that the substrate 10 is scanned. The applied laser light beam is not absorbed in the substrate 10 but absorbed only in the semiconductor layer 11. This absorption of the laser light beam causes the semiconductor layer 11 to generate heat locally, so that the bonding of atoms is cut off at the interface between the semiconductor layer 11 and the substrate 10, thereby forming a thermal decomposition layer 11a containing metal gallium (Ga) between the substrate 10 and the semiconductor layer 11. That is to say, with the application of the laser light beam to the semiconductor layer 11, the semiconductor layer 11 grown on the substrate 10 is bonded to the substrate 10 via the thermal decomposition layer 11a, while the bonding of atoms is cut off between the semiconductor layer 11 and the substrate 10.

Then, as shown in FIG. 1D, the substrate 10 is placed on a heating surface of a heated plate (not shown) at about 180° C. with the polymer film 51 bonded to the semiconductor layer 11. With this heat, the adhesive layer 51a foams to lose its adhesive power, so that the polymer film 51 can be easily peeled off from the semiconductor layer 11.

In the process step of applying the laser light beam shown in FIG. 1C, in order to reduce the stress resulting from the difference in thermal expansion coefficient between nitride semiconductor and sapphire caused when the temperature is reduced to room temperature after the growth of the semiconductor layer 11, the substrate 10 may be heated at such a temperature as suppressing the foaming of the adhesive layer 51a, e.g., at a temperature lower than 170° C.

In the first embodiment, the laser light beam pulses, and the output power of the laser light beam can be remarkably increased. Therefore, the substrate 10 can be easily separated from the semiconductor layer 11.

In addition, the laser light beam is applied to the substrate 10 with the substrate 10 scanned within its surface area. Thus, even if the substrate 10 has a relatively large diameter, the substrate 10 can be separated, irrespective of the beam diameter of the laser light beam.

As a light source for the laser light beam, a YAG (yttrium, aluminum and garnet) laser third-harmonic light beam with a wavelength of 355 nm or an emission line of a mercury lamp with a wavelength of 365 nm may be used, instead of the KrF excimer laser light beam. In the case where the emission line of the mercury lamp is used as a light source, though the power of the output light is inferior to that of the laser light beam, the spot size can be enlarged, so that the separation step can be performed in a short time.

The polymer film 51 preferably has a thickness of 100 μm or more so as to reduce the stress caused after the application of the laser light beam.

As described above, according to the first embodiment, the polymer film 51 is used as a supporting substrate provided on the upper surface of the semiconductor layer 11 to ease the handing of the semiconductor layer 11, and in addition, the polymer film 51 exhibits excellent formability. Therefore, even if the substrate 10 is warped to be in a convex or concave shape after the growth of the semiconductor layer 11, the polymer film 51 can be bonded uniformly.

In addition, since the adhesive layer 51a of the polymer film 51 has a characteristic of reducing or losing its adhesive power when heated, the adhesive layer 51a does not remain on the upper surface of the semiconductor layer 11.

Furthermore, the semiconductor layer 11 of the first embodiment is supported by the substrate 10 via the thermal decomposition layer 11a containing metal gallium. Accordingly, if an active layer of, for example, a nitride semiconductor including a pn junction, e.g., a light-emitting layer, is formed on the semiconductor layer 11 as an underlying layer, a lattice mismatch between the substrate 10 and the light-emitting layer is reduced as well as the light-emitting layer is less susceptible to the difference in thermal expansion coefficient between the light-emitting layer and the substrate 10. As a result, a light-emitting device having excellent crystallinity can be obtained.

Specifically, the semiconductor layer 11 is less susceptible to a lattice mismatch and a thermal mismatch occurring between the semiconductor layer 11 and the sapphire substrate 10. Therefore, it is possible to form an AlGaN semiconductor layer having a relatively high aluminum content and exhibiting a large lattice mismatch to GaN, without creating cracks. In addition, it is also possible to form an indium gallium nitride (InGaN) layer with excellent crystallinity having a relatively high indium content and exhibiting a large lattice mismatch to GaN.

Embodiment 2

A second embodiment of the present invention will be described with reference to the drawings.

FIGS. 2A through 2D show cross-sectional structures in the order of procedure of a method for fabricating a semiconductor device according to the second embodiment.

The second embodiment is a method for producing a semiconductor layer (wafer) with a substrate for use in a semiconductor device such as a light-emitting diode.

First, as shown in FIG. 2A, a nitride semiconductor layer, i.e., a semiconductor layer 11 of $In_xGa_yAl_{1-x-y}N$ (where $0 \leq x$, $y \leq 1$ and $0 \leq x+y \leq 1$), is grown by, for example, an MOCVD process to a thickness of about 3 μm on a sapphire substrate 10 (wafer) at a growth temperature of about 1000° C. In this case, in order to make the crystallinity of the semiconductor layer 11 excellent, the semiconductor layer 11 may be grown after a low-temperature buffer layer (not shown) of aluminum nitride or gallium nitride has been grown to a thickness of about 50 nm at a growth temperature of about 500° C. Subsequently, a sacrificial film 60 of silicon dioxide ($SiO_2$) is deposited by, for example, a chemical vapor deposition (CVD) process to a thickness of about 300 nm over the semiconductor layer 11.

Figure 2B:
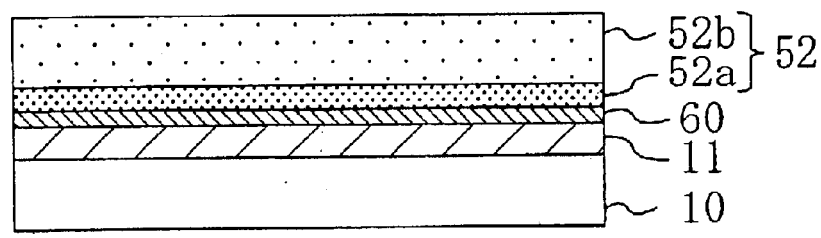

Next, as shown in FIG. 2B, a polymer film 52 in which a base material 52b of polyimide is coated with an adhesive layer 52a and which has a thickness of at least 100 μm is bonded to the upper surface of the sacrificial film 60.

Figure 2C:
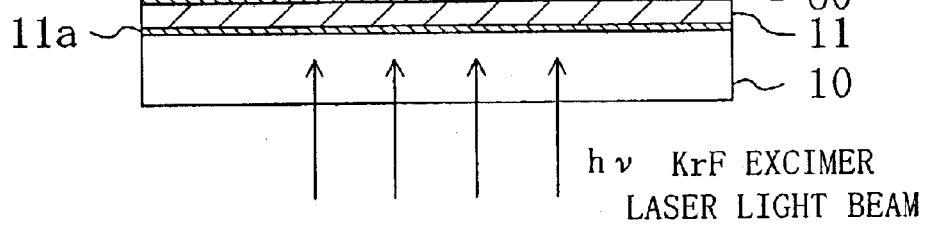

Then, as shown in FIG. 2C, a KrF excimer laser light beam having a pulsing wavelength of 248 nm is applied to a surface of the substrate 10 opposite to the semiconductor layer 11 such that the substrate 10 is scanned. The applied laser light beam is absorbed in the semiconductor layer 11. Accordingly, part of the semiconductor layer 11 where the light is absorbed generates heat, so that the bonding of atoms is cut off at the interface between the semiconductor layer 11 and the substrate 10, thereby forming a thermal decomposition layer 11a containing metal gallium between the substrate 10 and the semiconductor layer 11. That is to say, with the application of the laser light beam, the semiconductor layer 11 grown on the substrate 10 is bonded to the substrate 10 with the thermal decomposition layer 11a, while the bonding of atoms is cut off between the semiconductor layer 11 and the substrate 10.

Figure 2D:
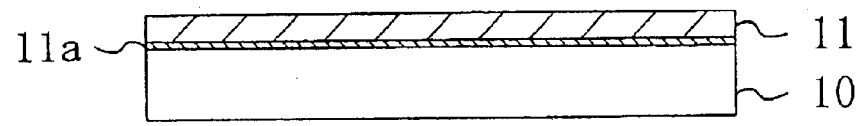

Then, as shown in FIG. 2D, the substrate 10 with the polymer film 52 bonded to the semiconductor layer 11 via the sacrificial film 60 is immersed in, for example, a hydrofluoric acid (HF) solution so as to selectively remove the sacrificial film 60, so that the polymer film 52 is easily peeled off from the semiconductor layer 11.

In the process step of applying the laser light beam shown in FIG. 2C, in order to reduce the stress resulting from the difference in thermal expansion coefficient between nitride semiconductor and sapphire created when the temperature is reduced to room temperature after the growth of the semiconductor layer 11, the substrate 10 may be heated at a temperature around which the base material 52b of the polymer film 52 does not change in quality, e.g., at about 300° C. or less. In this manner, since polyimide having heat resistance higher than polyester is used in the second embodiment, heating temperature can be further increased during the application of the laser light beam, for example, so that the stress caused in the semiconductor layer 11 during the formation of the thermal decomposition layer 11a is reduced. As a result, the occurrence of cracks in the semiconductor layer 11 during the separation can be suppressed. The polymer film 52 preferably has a thickness of 100 μm or more so as to reduce the stress caused after the application of the laser light beam.

As a light source for the laser light beam, a YAG laser third-harmonic light beam with a wavelength of 355 nm or an emission line of a mercury lamp with a wavelength of 365 nm may be used, instead of the KrF excimer laser light beam.

As described above, according to the second embodiment, the polymer film 52 is used as a supporting substrate provided on the upper surface of the semiconductor layer 11 to ease the handing of the semiconductor layer 11, and in addition, the polymer film 52 exhibits excellent formability. Therefore, even if the substrate 10 is warped to be in a convex or concave shape after the growth of the semiconductor layer 11, the polymer film 52 can be bonded uniformly.

In addition, since the polymer film 52 is bonded to the semiconductor layer 11 via the sacrificial film 60 which can be selectively removed by wet etching, the adhesive layer 52a does not remain on the surface of the semiconductor layer 11 after the polymer film 52 has been peeled off. As a result, the semiconductor layer 11 has a cleaner surface than in the first embodiment.

Furthermore, the semiconductor layer 11 of the second embodiment is supported by the substrate 10 with the thermal decomposition layer 11a containing metal gallium interposed therebetween. Accordingly, if an active layer of, for example, nitride semiconductor including a pn junction such as a light-emitting layer, is formed on the semiconductor layer 11 as an underlying layer, a lattice mismatch between the substrate 10 and the light-emitting layer is reduced as well as the light-emitting layer is less susceptible to the difference in thermal expansion coefficient between the light-emitting layer and the substrate 10. As a result, a light-emitting device having excellent crystallinity is achieved.

Specifically, the semiconductor layer 11 is less susceptible to a lattice mismatch and a thermal mismatch occurring between the semiconductor layer 11 and the sapphire substrate 10. Therefore, it is possible to form an aluminum-gallium-nitride (AlGaN) semiconductor layer having a relatively high aluminum content and exhibiting a large lattice mismatch to gallium nitride (GaN) without creating cracks. In addition, it is also possible to form an indium gallium nitride (InGaN) layer with excellent crystallinity having a relatively high indium content and exhibiting a large lattice mismatch to gallium nitride.

The sacrificial film 60 provided between the semiconductor layer 11 and the adhesive layer 52a of the polymer film 52 is not necessarily made of silicon dioxide and may be made of silicon nitride ($Si_3N_4$) or zinc oxide (ZnO). Alternatively, the sacrificial film 60 may be a multi-layer film containing at least two of these materials including silicon dioxide. It should be noted that an etching solution for the sacrificial film 60 needs to be selected so as to selectively remove the sacrificial film 60 without dissolving metal gallium contained in the thermal decomposition layer 11a. For example, if the sacrificial film 60 is made of silicon nitride, hydrofluoric acid is selected, whereas if the sacrificial film 60 is made of zinc oxide, nitric acid is selected.

Embodiment 3

A third embodiment of the present invention will be described with reference to the drawings.

The third embodiment is a method for fabricating a semiconductor device such as a light-emitting diode or a semiconductor laser.

FIGS. 3A through 3E show cross-sectional structures in the order of procedure of a method for fabricating a semiconductor device according to the third embodiment.

Figure 3A:
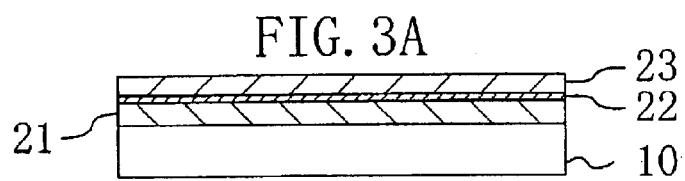
FIGS. 3A through 3E are cross-sectional views showing structures in respective process steps of a method for fabricating a semiconductor device according to a third embodiment of the present invention.

First, as shown in FIG. 3A, an n-type nitride semiconductor layer, i.e., a first semiconductor layer 21 of n-type $In_xGa_yAl_{1-x-y}N$ (where $0 \leq x$, $y \leq 1$ and $0 \leq x+y \leq 1$), is grown by, for example, an MOCVD process to a thickness of about 4 μm on a sapphire substrate (wafer) 10 at a growth temperature of about 1000° C. In this case, in order to make the crystallinity of the first semiconductor layer 21 excellent, the first semiconductor layer 21 may be grown after a low-temperature buffer layer (not shown) of aluminum nitride or gallium nitride has been grown to a thickness of about 50 nm at a growth temperature of about 500° C. Subsequently, a light-emitting layer 22 of $In_uGa_vAl_{1-u-v}N$ (where $0 \leq u$, $v \leq 1$ and $0 \leq u+v \leq 1$) is grown to a thickness of about 0.2 μm on the first semiconductor layer 21, and then a second semiconductor layer 23 of p-type $In_xGa_yAl_{1-x-y}N$ is grown to a thickness of about 0.8 μm on the light-emitting layer 22. Hereinafter, the first semiconductor layer 21, the light-emitting layer 22 and the second semiconductor layer 23 are referred to as an epitaxial layer. The light-emitting layer 22 may include a multiple quantum well structure.

Figure 3B:
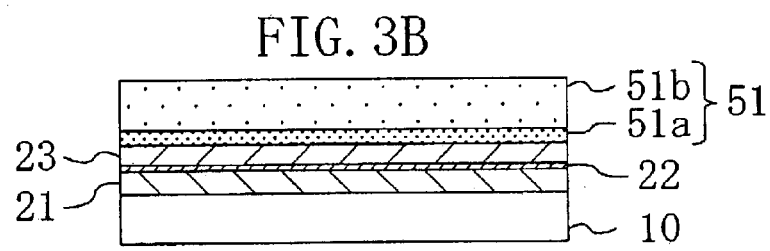

Next, as shown in FIG. 3B, a polymer film 51 including an adhesive layer 51a, which can be easily peeled off with heat, is bonded to the upper surface of the second semiconductor layer 23, as in the first embodiment.

Figure 3C:
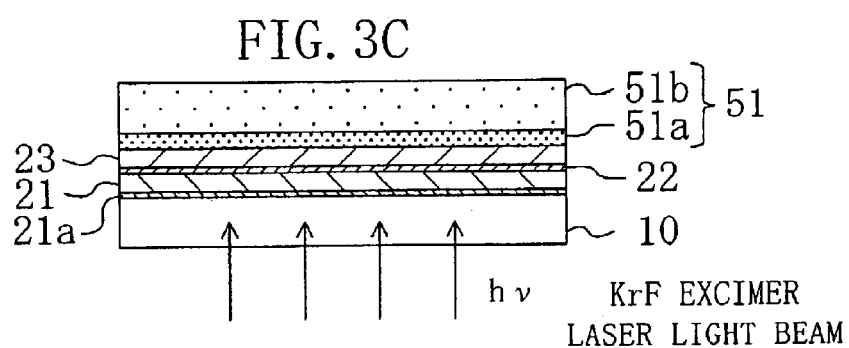

Then, as shown in FIG. 3C, a KrF excimer laser light beam having a pulsing wavelength of 248 nm is applied to a surface of the substrate 10 opposite to the first semiconductor layer 21 such that the substrate 10 is scanned. During this application, the first semiconductor layer 21 absorbs the laser light and generates heat in part where the light is absorbed, thereby forming a thermal decomposition layer 21a containing metal gallium in the first semiconductor layer 21 at the interface between the first semiconductor layer 21 and the substrate 10. If the power density of the laser light beam is sufficiently increased in this process step, the thickness of the thermal decomposition layer 21a in the first semiconductor layer 21 increases. As a result, the polymer film 51 and the epitaxial layer are peeled off from the substrate 10 immediately after the application of the laser light beam, thereby allowing separation of the substrate 10 from the epitaxial layer. In this step, the substrate 10 may be separated by heating the substrate 10 at temperatures higher than the melting point (about 29° C.) of metal gallium or immersing the substrate 10 in hydrochloric acid. Then, the epitaxial layer is supported by the polymer film 51.

In this step, in order to reduce the stress resulting from the difference in thermal expansion coefficient between nitride semiconductor and sapphire created when the temperature is reduced to room temperature after the growth of the epitaxial layer, the substrate 10 may be heated at such a temperature as suppressing the foaming of the adhesive layer 51a, e.g., at a temperature lower than 170° C. As a light source for the laser light beam, a YAG laser third-harmonic light beam or an emission line of a mercury lamp may be used, instead of the KrF excimer laser light beam. The polymer film 51 preferably has a thickness of 100 μm or more so as to reduce the stress caused after the application of the laser light beam.

Figure 3D:
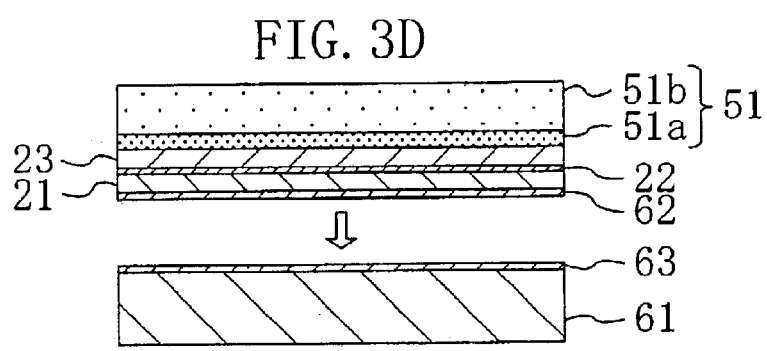

Then, as shown in FIG. 3D, metal gallium attached to the surface of the first semiconductor layer 21 on which the thermal decomposition layer 21a was formed is removed with hydrochloric acid (HCl). Thereafter, a first metal multi-layer film 62 of titanium (Ti) and gold (Au) is deposited by, for example, an electron beam evaporation process over a surface of the first semiconductor layer 21 opposite to the light-emitting layer 22. A conductive different-type substrate 61 of silicon (Si) with a principal surface whose surface orientation is a (100) plane is prepared, and a second metal multi-layer film 63 of an alloy of gold (Au) and tin (Sn) and gold (Au) is deposited by, for example, an electron beam evaporation process over the principal surface, simultaneously with the deposition of the first metal multi-layer film 62.

Figure 3E:
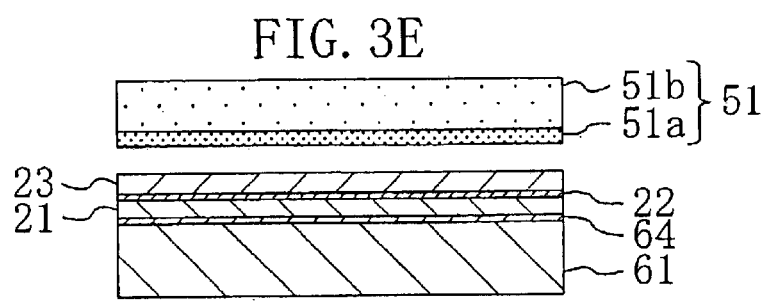

Next, as shown in FIG. 3E, the second metal multi-layer film 63 on the different-type substrate 61 and the first metal multi-layer film 62 on the first semiconductor layer 21 are bonded together such that the first and second metal multi-layer films 62 and 63 are opposed to each other. Then, the different-type substrate 61 is placed on a heating surface of a heated plate (not shown) at about 180° C. With this heat, the adhesive layer 51*a* foams to lose its adhesive power, so that the polymer film 51 can be easily peeled off from the second semiconductor layer 23. Thereafter, the temperature is increased with the second semiconductor layer 23 being pressed against the different-type substrate 61, so that the first semiconductor layer 21 and the different-type substrate 61 are bonded together with a third metal multi-layer film 64 formed by fusing the first and second metal multi-layer films 62 and 63 together.

In this case, the second metal multi-layer film 63 may have a three-layer structure of gold, tin and gold. The thickness of the uppermost gold layer is preferably as small as 5 nm, for example, because the uppermost gold layer is provided to prevent tin from being oxidized. Instead of tin, indium (In) may be used. Since tin and indium have melting points of 232° C. and 157° C., respectively, which are relatively low among metal materials, the fusing for the different-type substrate 61 can be performed at low temperatures. In this manner, the epitaxial layer and the different-type substrate 61 are bonded together, utilizing the alloying reaction of metals. As a result, the electric resistance at the interface between the epitaxial layer and the different-type substrate 61 can be reduced as well as the epitaxial layer and the substrate 61 can be bonded uniformly.

As described above, according to the third embodiment, the epitaxial layer including the light-emitting layer 22 can be transferred from the insulating sapphire substrate 10 onto the conductive different-type substrate 61 of silicon. In this transfer step, the polymer film 51 is used as a supporting substrate for easing the handing of the epitaxial layer. Therefore, even if the substrate 10 and the epitaxial layer are warped, the polymer film 51 can be easily bonded to the epitaxial layer as intended. In addition, the adhesive layer 51*a* of the polymer film 51 itself foams with heat to reduce its adhesive power (tackiness), so that the adhesive layer 51*a* does not remain, unlike an organic adhesive.

Further, the epitaxial layer is transferred onto the conductive different-type substrate 61, thereby securing the easiness of the handling of the epitaxial layer as well as allowing an electrode (n-side electrode) to be formed to face a p-side electrode on the different-type substrate 61. As a result, the chip size and the series resistance can be reduced, as compared to the case of a sapphire substrate. In addition, the heat radiation characteristic of the epitaxial layer is improved by removing the sapphire substrate 10, thus achieving higher output and longer lifetime of the device. Moreover, it is possible to cleave the epitaxial layer along a plane in the different-type substrate 61 along which the cleavage is easy performed. Thus, in the case of the application to a semiconductor laser, for example, the cleavage plane allows an excellent resonant cavity to be formed. As a result, the threshold current in the laser can be reduced, and the performance of the laser can be enhanced.

Embodiment 4

A fourth embodiment of the present invention will be described with reference to the drawings.

The fourth embodiment is a method for fabricating a semiconductor device such as a light-emitting diode or a semiconductor laser.

FIGS. 4A through 4E show cross-sectional structures in the order of procedure of a method for fabricating a semiconductor device according to the fourth embodiment.

Figure 4A:
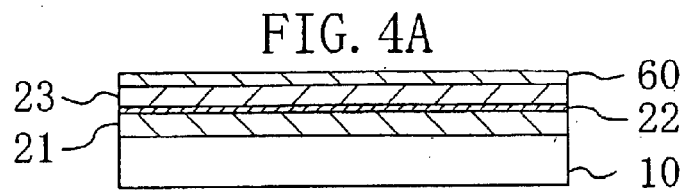
FIGS. 4A through 4E are cross-sectional views showing structures in respective process steps of a method for fabricating a semiconductor device according to a fourth embodiment of the present invention.

First, as shown in FIG. 4A, a first semiconductor layer 21 of n-type $In_xGa_yAl_{1-x-y}N$ (where $0 \leq x$, $y \leq 1$ and $0 \leq x+y \leq 1$), is grown by, for example, an MOCVD process to a thickness of about 4 $\mu$m on a sapphire substrate 10 (wafer) at a growth temperature of about 1000° C. In this case, in order to make the crystallinity of the first semiconductor layer 21 excellent, the first semiconductor layer 21 may be grown after a low-temperature buffer layer (not shown) of aluminum nitride or gallium nitride has been grown to a thickness of about 50 nm at a growth temperature of about 500° C. Subsequently, a light-emitting layer 22 of $In_uGa_vAl_{1-u-v}N$ (where $0 \leq u$, $v \leq 1$ and $0 \leq u+v \leq 1$) is grown to a thickness of about 0.2 $\mu$m on the first semiconductor layer 21, and then a second semiconductor layer 23 of p-type $In_xGa_yAl_{1-x-y}N$ is grown to a thickness of about 0.8 $\mu$m on the light-emitting layer 22. Hereinafter, the first semiconductor layer 21, the light-emitting layer 22 and the second semiconductor layer 23 are referred to as an epitaxial layer. The light-emitting layer 22 may include a multiple quantum well structure. Thereafter, a sacrificial film 60 of silicon dioxide is deposited by, for example, a CVD process to a thickness of about 300 nm over the second semiconductor layer 23.

Figure 4B:
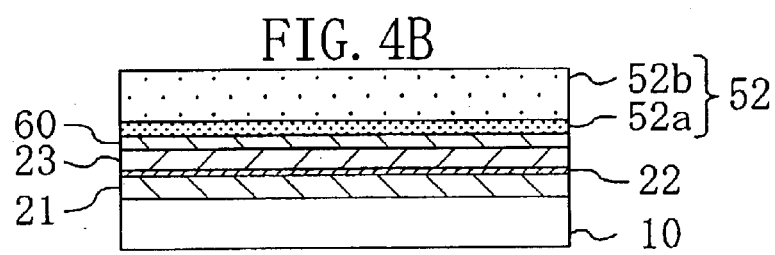

Next, as shown in FIG. 4B, a polymer film 52 in which a base material 52*b* of polyimide is coated with an adhesive layer 52*a* and which has a thickness of at least 100 $\mu$m is bonded to the upper surface of the sacrificial film 60, as in the second embodiment.

Figure 4C:
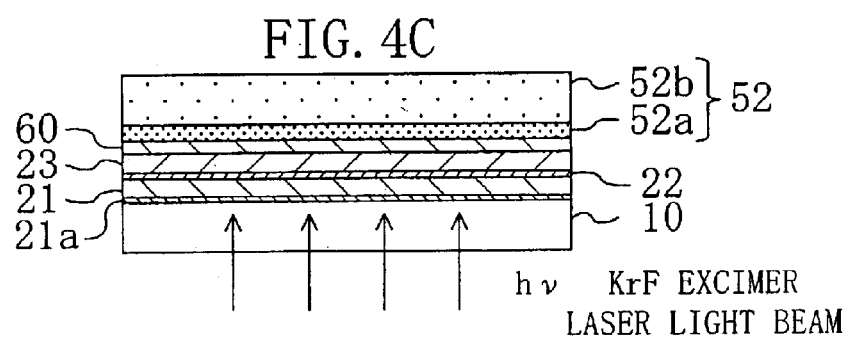

Then, as shown in FIG. 4C, a KrF excimer laser light beam having a pulsing wavelength of 248 nm is applied to a surface of the substrate 10 opposite to the first semiconductor layer 21 such that the substrate 10 is scanned. During this application, the first semiconductor layer 21 absorbs the laser light to generate heat in part where the light is absorbed, thereby forming a thermal decomposition layer 21*a* containing metal gallium in the first semiconductor layer 21 at the interface between the first semiconductor layer 21 and the substrate 10. If the power density of the laser light beam is sufficiently increased at this process step, the thickness of the thermal decomposition layer 21*a* in the first semiconductor layer 21 increases. As a result, the polymer film 52 and the epitaxial layer are peeled off from the substrate 10 immediately after the application of the laser light beam, thereby allowing separation of the substrate 10 from the epitaxial layer. In this step, the substrate 10 may be separated by heating the substrate 10 at temperatures higher than the melting point (about 29° C.) of metal gallium or immersing the substrate 10 in hydrochloric acid. Then, the epitaxial layer is supported by the polymer film 52 with the sacrificial film 60 interposed therebetween.

In this step, in order to reduce the stress resulting from the difference in thermal expansion coefficient between nitride semiconductor and sapphire caused when the temperature is reduced to room temperature after the growth of the epitaxial layer, the substrate 10 may be heated at such a temperature around which the base material 52*b* of the polymer film 52 does not change in quality, e.g., at about 300° C. or less. In this manner, since polyimide having heat resistance higher than polyester is used in the fourth embodiment, heating temperature can be set at higher temperatures than in the case of polyester, so that the stress caused in the semiconductor layer 21 is reduced. As a result, the occurrence of cracks in the semiconductor layer 21 during the separation can be suppressed. The polymer film 52 preferably has a thickness of 100 μm or more so as to reduce the stress caused after the application of the laser light beam.

As a light source for the laser light beam, a YAG laser third-harmonic light beam with a wavelength of 355 nm or an emission line of a mercury lamp with a wavelength of 365 nm may be used, instead of the KrF excimer laser light beam.

Figure 4D:
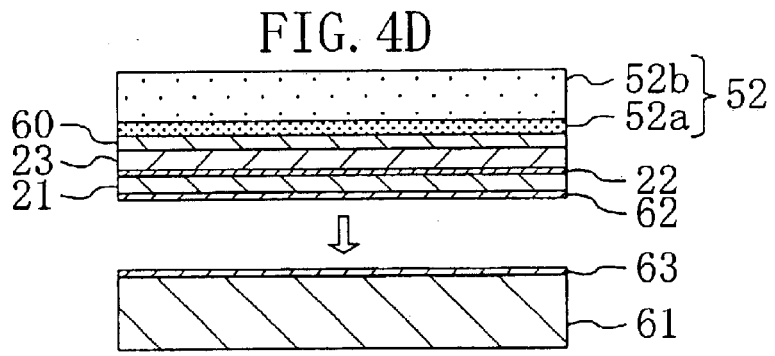

Then, as shown in FIG. 4D, metal gallium attached to the surface of the first semiconductor layer 21 on which the thermal decomposition layer 21a was formed is removed with hydrochloric acid. Thereafter, a first metal multi-layer film 62 of titanium and gold is deposited by, for example, an electron beam evaporation process over a surface of the first semiconductor layer 21 opposite to the light-emitting layer 22. A conductive different-type substrate 61 of silicon with a principal surface whose surface orientation is a (100) plane is prepared, and a second metal multi-layer film 63 of an alloy of gold and tin and gold is deposited by, for example, an electron beam evaporation process over the principal surface, simultaneously with the deposition of the first metal multi-layer film 62.

Figure 4E:
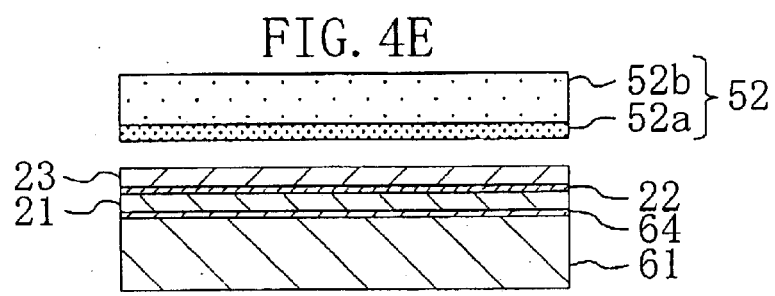

Next, as shown in FIG. 4E, the second metal multi-layer film 63 on the different-type substrate 61 and the first metal multi-layer film 62 on the first semiconductor layer 21 are bonded together such that the first and second metal multi-layer films 62 and 63 are opposed to each other. Then, the different-type substrate 61 is placed on a heating surface of a heated plate (not shown) at a temperature equal to or less than about 300° C. at which polyimide is changed in quality. Thereafter, the polymer film 52 is heated while being pressed against the different-type substrate 61, so that the first semiconductor layer 21 and the different-type substrate 61 are bonded together with a third metal multi-layer film 64 formed by fusing the first and second metal multi-layer films 62 and 63 together. The second metal multi-layer film 63 may contain indium, instead of tin.

Thereafter, the different-type substrate 61 to which the epitaxial layer is bonded is immersed in, for example, a hydrofluoric acid solution so that the sacrificial film 60 is selectively removed, thereby peeling off the polymer film 52 from the semiconductor layer 11.

As described above, according to the fourth embodiment, the epitaxial layer including the light-emitting layer 22 can be transferred from the insulating sapphire substrate 10 onto the conductive different-type substrate 61 of silicon. In this transfer step, the polymer film 52 is used as a supporting substrate for easing the handing of the epitaxial layer. Therefore, even if the substrate 10 and the epitaxial layer are warped, the polymer film 52 can be easily bonded to the epitaxial layer as intended. In addition, since the polymer film 52 is bonded to the epitaxial layer with the acid-soluble sacrificial film 60 interposed therebetween, no adhesive remains on the surface of the second semiconductor layer 23.

Further, the epitaxial layer is transferred to the conductive different-type substrate 61, thereby allowing an electrode, an n-side electrode in this case, to be also formed on the different-type substrate 61. As a result, the chip size and the series resistance can be reduced, as compared to the case of a sapphire substrate. In addition, the heat radiation characteristic of the epitaxial layer is improved by removing the sapphire substrate 10, thus achieving higher output and longer lifetime of the device. Moreover, it is possible to cleave the epitaxial layer along a plane in the different-type substrate 61 along which the cleavage is easy performed. Thus, in the case of the application to a semiconductor laser, for example, the cleavage plane allows an excellent resonant cavity to be formed. As a result, the threshold current in the laser can be reduced, and the performance of the laser can be enhanced.

The sacrificial film 60 provided between the second semiconductor layer 23 and the adhesive layer 52a of the polymer film 52 is not necessarily made of silicon dioxide and may be made of silicon nitride or zinc oxide. Alternatively, the sacrificial film 60 may be a multi-layer film containing at least two of these materials including silicon dioxide. It should be noted that an etching solution for the sacrificial film 60 needs to be selected so as to selectively remove the sacrificial film 60 without dissolving metal contained in the third metal multi-layer film 64. For example, if the sacrificial film 60 is made of silicon nitride, hydrofluoric acid is selected, whereas if the sacrificial film 60 is made of zinc oxide, nitric acid is selected.

Embodiment 5

A fifth embodiment of the present invention will be described with reference to the drawings.

The fifth embodiment is a semiconductor-device-fabrication method for regrowing an epitaxial layer including an active layer (light-emitting layer) using, as an underlying layer, the semiconductor layer 11 with the thermal decomposition layer 11a interposed between the substrate 10 and the semiconductor layer 11, described in the first or second embodiment.

FIGS. 5A through 5D and FIGS. 6A and 6B show cross-sectional structures in the order of procedure of a method for fabricating a semiconductor device according to the fifth embodiment.

Figure 5A:
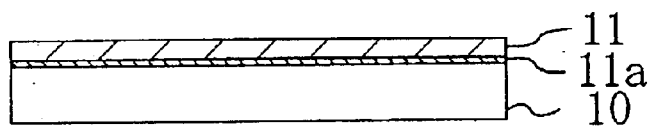
FIGS. 5A through 5D are cross-sectional views showing structures in respective process steps of a method for fabricating a semiconductor device according to a fifth embodiment of the present invention.

First, as shown in FIG. 5A, in the same manner as illustrated in FIG. 1D for the first embodiment or the FIG. 2D for the second embodiment, the polymer film 51 or 52 is removed, and a substrate 10 is prepared with a semiconductor layer 11 (hereinafter, referred to as an underlying layer 11) of about 4 μm in thickness exposed. In this case, the underlying layer 11 is made of, for example, an n-type undoped or silicon-doped nitride such as aluminum nitride, gallium nitride or aluminum gallium nitride.

Figure 5B:
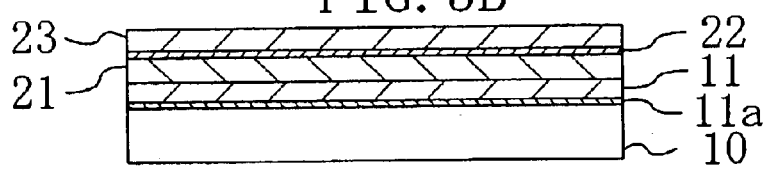

Next, as shown in FIG. 5B, an n-type nitride semiconductor layer, i.e., a first semiconductor layer 21 of n-type $In_xGa_yAl_{1-x-y}N$ (where $0 \leq x$, $y \leq 1$ and $0 \leq x+y \leq 1$), is grown by, for example, an MOVPE process to a thickness of about 0.5 μm on the underlying layer 11 at a growth temperature of about 1000° C. Subsequently, a light-emitting layer 22 of $In_uGa_vAl_{1-u-v}N$ (where $0 \leq u$, $v \leq 1$ and $0 \leq u+v \leq 1$) is grown to a thickness of about 0.2 μm on the first semiconductor layer 21, and then a second semiconductor layer 23 of p-type $In_xGa_yAl_{1-x-y}N$ is grown to a thickness of about 0.8 μm on the light-emitting layer 22. Hereinafter, the first semiconductor layer 21, the light-emitting layer 22 and the second semiconductor layer 23 are referred to as an epitaxial layer. The light-emitting layer 22 may include a multiple quantum well structure.

Since the underlying layer 11 is formed over the sapphire substrate 10 with the thermal decomposition layer 11a containing metal gallium interposed therebetween, the epitaxial layer is grown without being affected by a lattice mismatch or a thermal mismatch between nitride semiconductor and sapphire. Accordingly, as compared to the third embodiment in which the epitaxial layer is grown directly on the substrate 10, the crystallinity of the epitaxial layer is markedly improved, thus increasing the luminance of the light-emitting device.

Figure 5C:
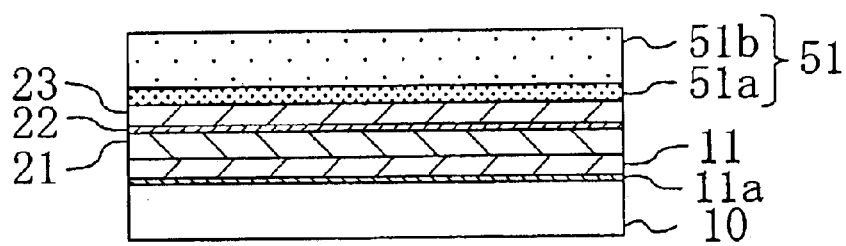

Next, as shown in FIG. 5C, a polymer film 51 including an adhesive layer 51a, which can be easily peeled off with heat, is bonded to the upper surface of the second semiconductor layer 23, as in the first embodiment. Thereafter, the epitaxial layer, to which the polymer film 51 has been bonded, and the substrate 10 are immersed in hydrochloric acid so that metal gallium contained in the thermal decomposition layer 11a is selectively wet etched or the epitaxial layer and the substrate 10 are heated at temperatures higher than the melting point (about 29° C.) of metal gallium, thereby separating the substrate 10 from the epitaxial layer.

Figure 5D:
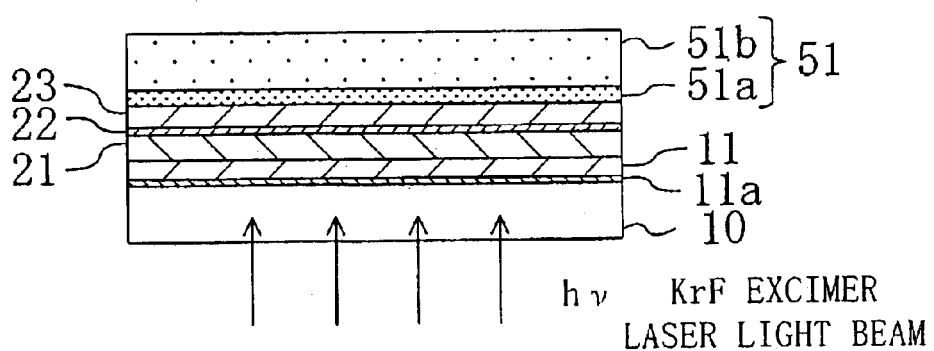

In this process step, in the case where the thermal decomposition layer 11a is not formed at the entire interface between the underlying layer 11 and the substrate 10 and where the substrate 10 is not separated only by wet etching, a KrF excimer laser light beam with a wavelength of 248 nm is preferably applied to a surface of the substrate 10 opposite to the underlying layer 11, as shown in FIG. 5D. In this case, in order to reduce the stress resulting from the difference in thermal expansion coefficient between nitride semiconductor and sapphire created when the temperature is reduced to room temperature after the growth of the epitaxial layer, the substrate 10 is preferably heated at such a temperature as suppressing the foaming of the adhesive layer 51a, e.g., at a temperature lower than 170° C. As a light source for the laser light beam, a YAG laser third-harmonic light beam or an emission line of a mercury lamp may be used, instead of the KrF excimer laser light beam. The polymer film 51 preferably has a thickness of 100 μm or more so as to reduce the stress caused after the application of the laser light beam.

Figure 6A:
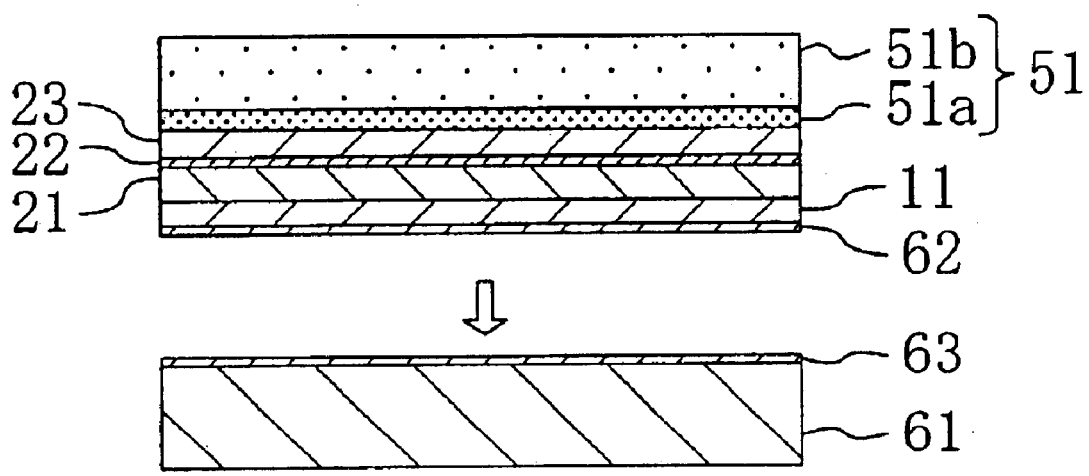
FIGS. 6A and 6B are cross-sectional views showing structures in respective process steps of a method for fabricating a semiconductor device according to the fifth embodiment.

Then, as shown in FIG. 6A, metal gallium attached to the surface of the underlying layer 11 on which the thermal decomposition layer 21a was formed is removed with hydrochloric acid. Thereafter, a first metal multi-layer film 62 of titanium and gold is deposited by, for example, an electron beam evaporation process over a surface of the underlying layer 11 opposite to the first semiconductor layer 21. A conductive different-type substrate 61 of silicon with a principal surface whose surface orientation is a (100) plane is prepared, and a second metal multi-layer film 63 of an alloy of gold and tin and gold is deposited by, for example, an electron beam evaporation process over the principal surface, simultaneously with the deposition of the first metal multi-layer film 62.

Figure 6B:
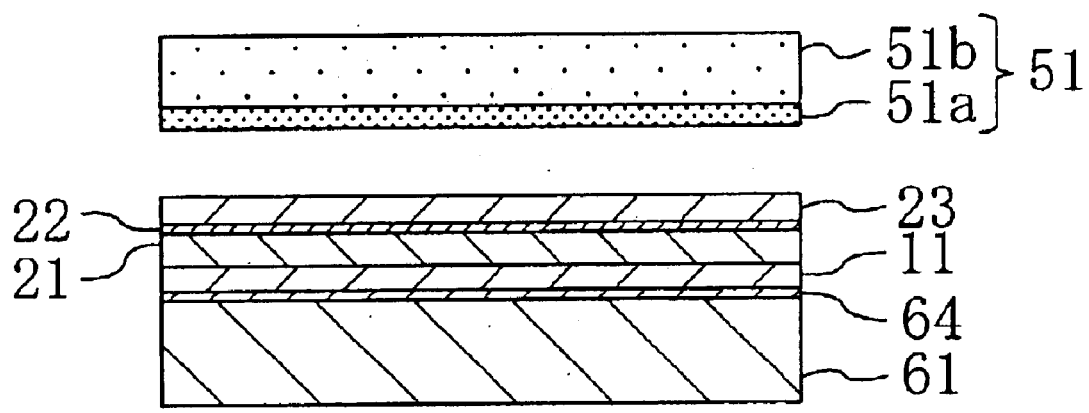

Next, as shown in FIG. 6B, the second metal multi-layer film 63 on the different-type substrate 61 and the first metal multi-layer film 62 on the underlying layer 11 are bonded together such that the first and second metal multi-layer films 62 and 63 are opposed to each other. Then, the different-type substrate 61 is placed on a heating surface of a heated plate (not shown) at a temperature of about 180° C. With this heat, the adhesive layer 51a foams to lose its adhesive power, so that the polymer film 51 can be easily peeled off from the second semiconductor layer 23. Thereafter, the second semiconductor layer 23 is heated while being pressed against the different-type substrate 61, so that the underlying layer 11 and the different-type substrate 61 are bonded together with a third metal multi-layer film 64 formed by fusing the first and second metal multi-layer films 62 and 63 together.

In this case, the second metal multi-layer film 63 may have a three-layer structure of gold, tin and gold. The thickness of the uppermost gold layer is preferably as small as 5 nm, for example, because the uppermost gold layer is provided to prevent tin from being oxidized. Instead of tin, indium may be used.

In this manner, according to the fifth embodiment, the epitaxial layer including the light-emitting layer 22 is transferred from the insulating sapphire substrate 10 onto the conductive silicon different-type substrate 61 as intended, as in the third embodiment.

In addition, since an epitaxial layer is regrown on the underlying layer 11 formed by the method described in the first or second embodiment, the crystallinity of the epitaxial layer of the fifth embodiment is markedly improved. Accordingly, in the case of the application to a semiconductor laser, for example, the performance of the laser can be further enhanced, e.g., the threshold current in the laser can be further reduced.

Embodiment 6

A sixth embodiment of the present invention will be described with reference to the drawings.

The sixth embodiment is a semiconductor-device-fabrication method for regrowing an epitaxial layer including an active layer (light-emitting layer) using, as an underlying layer, the semiconductor layer 11 with the thermal decomposition layer 11a interposed between the substrate 10 and the semiconductor layer 11, described in the first or second embodiment.

FIGS. 7A through 7D and FIGS. 8A and 8B show cross-sectional structures in the order of procedure of a method for fabricating a semiconductor device according to the sixth embodiment.

Figure 7A:
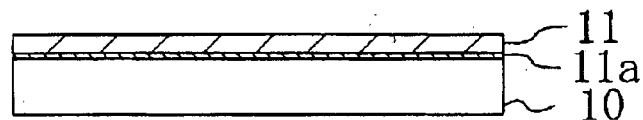
FIGS. 7A through 7D are cross-sectional views showing structures in respective process steps of a method for fabricating a semiconductor device according to a sixth embodiment of the present invention.

First, as shown in FIG. 7A, in the same manner as illustrated in FIG. 1D for the first embodiment or the FIG. 2D for the second embodiment, the polymer film 51 or 52 is removed, and a substrate 10 is prepared with a semiconductor layer 11 (hereinafter, referred to as an underlying layer 11) of about 4 μm in thickness exposed. In this case, the underlying layer 11 is made of, for example, an n-type undoped or silicon-doped nitride such as aluminum nitride, gallium nitride or aluminum gallium nitride.

Figure 7B:
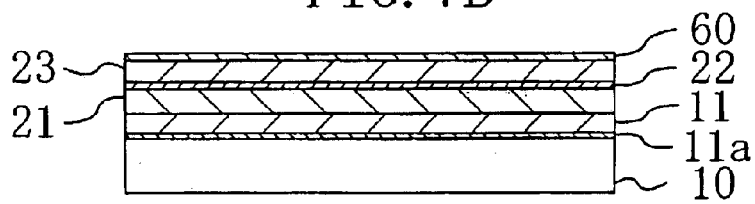

Next, as shown in FIG. 7B, an n-type nitride semiconductor layer, i.e., a first semiconductor layer 21 of n-type $In_xGa_yAl_{1-x-y}N$ (where $0 \leq x$, $y \leq 1$ and $0 \leq x+y \leq 1$), is grown by, for example, an MOVPE process to a thickness of about 0.5 μm on the underlying layer 11 at a growth temperature of about 1000° C. In this case, in order to make the crystallinity of the first semiconductor layer 21 excellent, the first semiconductor layer 21 may be grown after a low-temperature buffer layer (not shown) of aluminum nitride or gallium nitride has been grown to a thickness of about 50 nm at a growth temperature of about 500° C. Subsequently, a light-emitting layer 22 of $In_uGa_vAl_{1-u-v}N$ (where $0 \leq u$, $v \leq 1$ and $0 \leq u+v \leq 1$) is grown to a thickness of about 0.2 μm, on the first semiconductor layer 21, and then a second semiconductor layer 23 of p-type $In_xGa_yAl_{1-x-y}N$ is grown to a thickness of about 0.8 μm on the light-emitting layer 22. Hereinafter, the first semiconductor layer 21, the light-emitting layer 22 and the second semiconductor layer 23 are referred to as an epitaxial layer. The light-emitting layer 22 may include a multiple quantum well structure. Since the underlying layer 11 is formed over the sapphire substrate 10 with the thermal decomposition layer 11a containing metal gallium interposed therebetween as in the fifth embodiment, the epitaxial layer is grown without being affected by a lattice mismatch or a thermal mismatch between nitride semiconductor and sapphire. Accordingly, as compared to the fourth embodiment in which the epitaxial layer is grown directly on the substrate 10, the crystallinity of the epitaxial layer is markedly improved. Subsequently, a sacrificial film 60 of silicon dioxide is deposited by, for example, a CVD process to a thickness of about 300 nm over the second semiconductor layer 23.

Figure 7C:
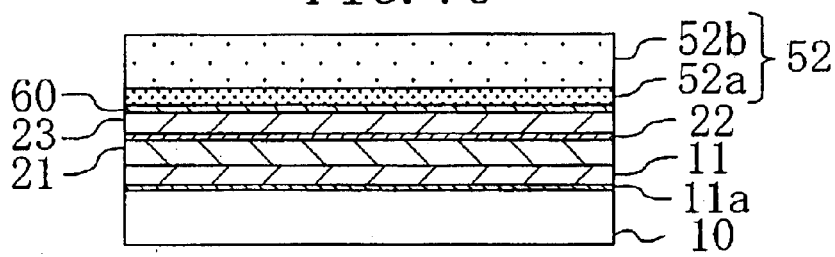

Then, as shown in FIG. 7C, a polymer film 52 in which a base material 52b of polyimide is coated with an adhesive layer 52a and which has a thickness of at least 100 μm is bonded to the upper surface of the sacrificial film 60, as in the fourth embodiment. Thereafter, the epitaxial layer, to which the polymer film 52 is bonded, and the substrate 10 are immersed in hydrochloric acid so that metal gallium contained in the thermal decomposition layer 11a is selectively wet etched or the epitaxial layer and the substrate 10 are heated at temperatures higher than the melting point (about 29° C.) of metal gallium, thereby separating the substrate 10 from the epitaxial layer.

Figure 7D:
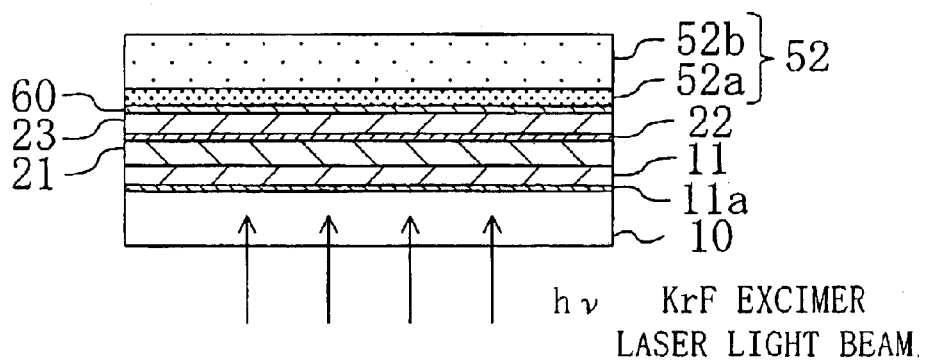

In this process step, in the case where the thermal decomposition layer 11a is not formed at the entire interface between the underlying layer 11 and the substrate 10 and where the substrate 10 is not separated only by wet etching, a KrF excimer laser light beam with a wavelength of 248 nm is preferably applied to a surface of the substrate 10 opposite to the underlying layer 11, as shown in FIG. 7D. In this case, in order to reduce the stress resulting from the difference in thermal expansion coefficient between nitride semiconductor and sapphire caused when the temperature is reduced to room temperature after the growth of the epitaxial layer, the substrate 10 is preferably heated at such a temperature as suppressing the change in quality of the base material 52b of the polymer film 52, e.g., at a temperature lower than 300° C. As a light source for the laser light, a YAG laser third-harmonic light beam or an emission line of a mercury lamp may be used, instead of the KrF excimer laser light beam. The polymer film 52 preferably has a thickness of 100 μm or more so as to reduce the stress caused after the application of the laser light beam.

Figure 8A:
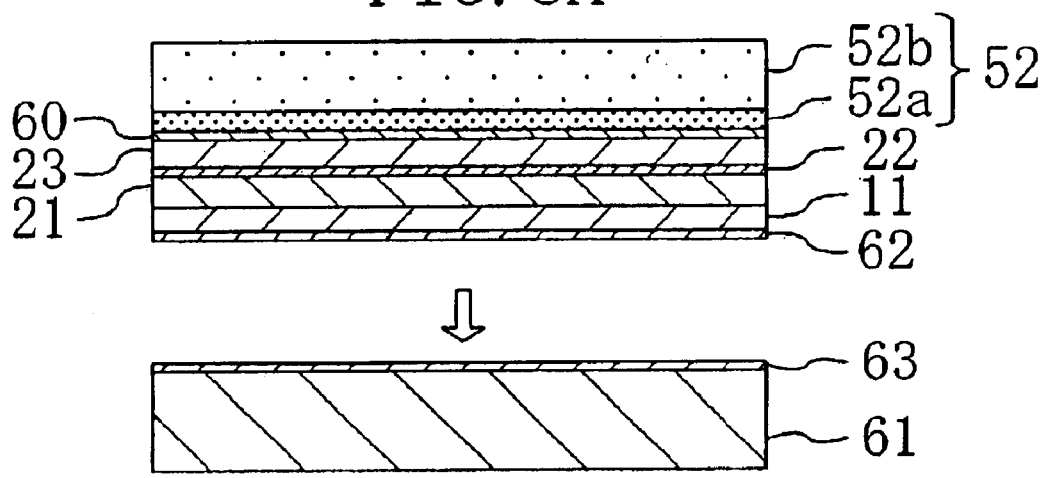
FIGS. 8A and 8B are cross-sectional views showing structures in respective process steps of a method for fabricating a semiconductor device according to the sixth embodiment.

Then, as shown in FIG. 8A, metal gallium attached to the surface of the underlying layer 11 on which the thermal decomposition layer 21a was formed is removed with hydrochloric acid. Thereafter, a first metal multi-layer film 62 of titanium and gold is deposited by, for example, an electron beam evaporation process over a surface of the underlying layer 11 opposite to the first semiconductor layer 21. A conductive different-type substrate 61 of silicon with a principal surface whose surface orientation is a (100) plane is prepared, and a second metal multi-layer film 63 of an alloy of gold and tin and gold is deposited by, for example, an electron beam evaporation process over the principal surface, simultaneously with the deposition of the first metal multi-layer film 62.

Figure 8B:
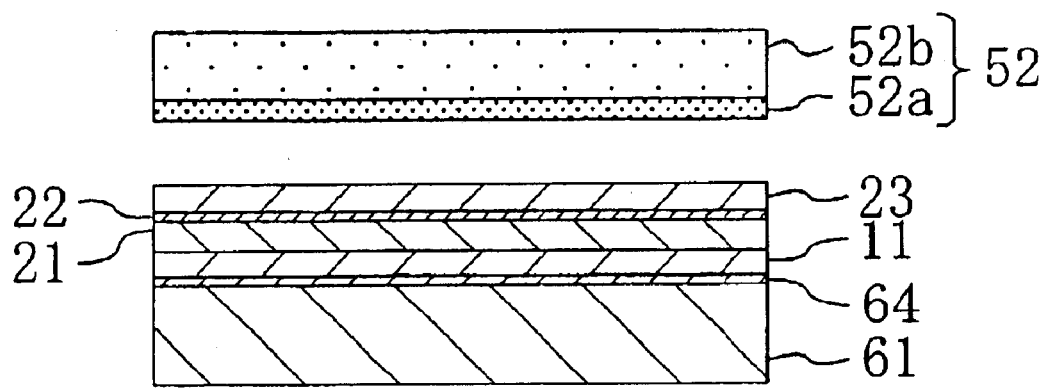

Next, as shown in FIG. 8B, the second metal multi-layer film 63 on the different-type substrate 61 and the first metal multi-layer film 62 on the underlying layer 11 are bonded together such that the first and second metal multi-layer films 62 and 63 are opposed to each other. Then, the different-type substrate 61 is placed on a heating surface of a heated plate (not shown) at a temperature equal to or less than about 300° C. at which polyimide is changed in quality. Thereafter, the polymer film 52 is heated while being pressed against the different-type substrate 61, so that the underlying layer 11 and the different-type substrate 61 are bonded together with a third metal multi-layer film 64 formed by fusing the first and second metal multi-layer films 62 and 63 together. The second metal multi-layer film 63 may contain indium, instead of tin.

Subsequently, the different-type substrate 61 to which the epitaxial layer has been bonded is immersed in, for example, a hydrofluoric acid solution so as to selectively remove the sacrificial film 60, thereby peeling off the polymer film 52 from the semiconductor layer 11.

In this manner, according to the sixth embodiment, the epitaxial layer including the light-emitting layer 22 is transferred from the insulating sapphire substrate 10 onto the conductive silicon different-type substrate 61 as intended, as in the fourth embodiment.

In addition, since an epitaxial layer is regrown on the underlying layer 11 formed by the method described in the first or second embodiment, the crystallinity of the epitaxial layer of the sixth embodiment is markedly improved. Thus, in the case of the application to a semiconductor laser, for example, the threshold current in the laser can be further reduced, the performance of the laser can further be enhanced.

The sacrificial film 60 provided between the second semiconductor layer 23 and the adhesive layer 52a of the polymer film 52 is not necessarily made of silicon dioxide and may be made of silicon nitride or zinc oxide. Alternatively, the sacrificial film 60 may be a multi-layer film containing at least two of these materials including silicon dioxide. It should be noted that an etching solution for the sacrificial film 60 needs to be selected so as to selectively remove the sacrificial film 60 without dissolving metal contained in the third metal multi-layer film 64. For example, if the sacrificial film 60 is made of silicon nitride, hydrofluoric acid is selected, whereas if the sacrificial film 60 is made of zinc oxide, nitric acid is selected.

In the foregoing first through sixth embodiments, the surface orientation of the principal surface of the sapphire substrate 10 is not specifically limited. The principal surface may be in a general orientation, e.g., a (0001) plane or may be in an off-orientation, i.e., slightly inclined from the general orientation.

The substrate 10 on which the underlying layer 11 or the epitaxial layer is grown is not necessarily made of sapphire and is preferably made of magnesium oxide (MgO) or lithium gallium aluminum oxide (LiGa$_x$Al$_{1-x}$O$_2$ where 0≦x≦1), for example. Then, it is possible to form a nitride semiconductor having a wide bandgap and exhibiting excellent crystallinity. This allows higher luminance and lower operating current, thus achieving a high-performance light-emitting device, i.e., a light-emitting diode or a semiconductor laser, which emits violet light in the visible range and having excellent electric and optical characteristics.

In the third through sixth embodiments, instead of the sapphire substrate 10, silicon (Si) is used for the different-type substrate 61 onto which the epitaxial layer is to be transferred. However, the present invention is not limited to these embodiments. Specifically, a low-resistance highly-doped semiconductor substrate with a principal surface whose surface orientation is a (100) plane and which is made of a semiconductor such as gallium arsenide (GaAs), gallium phosphide (GaP), indium phosphide (InP) or silicon carbide (SiC) or a metal substrate of, for example, copper (Cu) may be used as a different-type substrate. For example, a substrate of silicon, silicon carbide or metal diffuses heat effectively. Accordingly, if such a substrate is applied to a semiconductor laser, it is possible to extend the lifetime of the laser. In addition, since it is easy to cleave a substrate of gallium arsenide, gallium phosphide or indium phosphide, an excellent cleavage plane is also created in the epitaxial layer during the cleavage. Therefore, if such a substrate is applied to a semiconductor laser, an excellent end facet of the resonant cavity can be formed. As a result, the threshold current in the laser can be reduced, thus enhancing the performance of the laser.

The underlying layer 11 and the semiconductor layers of the epitaxial layer are not necessarily formed by an MOCVD process and may be formed by a molecular beam epitaxy process or a hydride vapor phase epitaixy growth process, for example. The semiconductor layers of the epitaxial layer may be formed by mutually different processes.

What is claimed is:

1. A method for fabricating a semiconductor device, the method comprising the steps of:
    a) growing a first semiconductor layer on a first substrate;
    b) bonding an adhesive surface of a polymer film including an adhesive layer, which can be peeled off with heat, to an upper surface of the first semiconductor layer;
    c) applying irradiating light having a wavelength at which the light passes through the first substrate and is absorbed in the first semiconductor layer, to a surface of the first substrate opposite to the first semiconductor layer, thereby forming a thermal decomposition layer between the first semiconductor layer and the first substrate as a result of thermal decomposition of the first semiconductor layer; and
    d) heating the first substrate to lower the adhesive power of the adhesive layer, thereby peeling off the polymer film from the first semiconductor layer.

2. The method of claim 1, wherein the polymer film is made of polyester.

3. The method of claim 1, wherein the first semiconductor layer includes an active layer.

4. The method of claim 1, including, between the steps c) and d), the steps of:
    e) selectively removing the thermal decomposition layer, thereby separating the first substrate from the first semiconductor layer; and
    f) bonding a second substrate made of a material different from that of the first substrate, to a surface of the first semiconductor layer from which the first substrate has been separated.

5. The method of claim 4, wherein the step f) includes the step of interposing a metal film between the second substrate and the first semiconductor layer.

6. The method of claim 5, wherein the metal film contains indium or tin.

7. The method of claim 4, including the step g) of cleaving the second substrate and the first semiconductor layer using a plane in the second substrate along which cleavage is performed easily, after the step f) has been performed.

8. The method of claim 4, wherein the second substrate is made of a material selected from the group consisting of silicon, gallium arsenide, gallium phosphide, indium phosphide, silicon carbide and metal.

9. The method of claim 1, further including the step h) of growing a second semiconductor layer on the first semiconductor layer, after the step d) has been performed.

10. The method of claim 9, wherein the second semiconductor layer includes an active layer.

11. The method of claim 9, including the steps of:
    i) selectively removing the thermal decomposition layer, thereby separating the first substrate from the first semiconductor layer; and
    j) bonding a second substrate made of a material different from that of the first substrate, to a surface of the first semiconductor layer from which the first substrate has been separated, after the step h) has been performed.

12. The method of claim 11, wherein the step j) includes the step of interposing a metal film between the second substrate and the first semiconductor layer.

13. The method of claim 12, wherein the metal film contains indium or tin.

14. The method of claim 11, including the step k) of cleaving the second substrate, the first semiconductor layer and the second semiconductor layer using a plane in the second substrate along which cleavage is performed easily, after the step j) has been performed.

15. The method of claim 9, wherein the second semiconductor layer is made of a compound semiconductor containing nitrogen.

16. The method of claim 1, wherein the first semiconductor layer is made of a compound semiconductor containing nitrogen.

17. The method of claim 1, wherein the first substrate is made of a material selected from the group consisting of sapphire, magnesium oxide and lithium gallium aluminum oxide ($LiGa_xAl_{1-x}O_2$ where $0 \leq x \leq 1$).

18. The method of claim 1, wherein the irradiating light is a pulsing laser light beam.

19. The method of claim 1, wherein the irradiating light is an emission line of a mercury lamp.

20. The method of claim 1, wherein the irradiating light is applied such that the first substrate is scanned within the surface area of the first substrate.

21. The method of claim 1, wherein the irradiating light is applied while the first substrate is heated.

22. The method of claim 21, wherein the first substrate is heated at a temperature at which the polymer film or the adhesive layer does not change in quality.

23. A method for fabricating a semiconductor device, the method comprising the steps of:
    a) growing a first semiconductor layer on a first substrate;
    b) forming a sacrificial film on the first semiconductor layer, and then bonding an adhesive surface of a polymer film including an adhesive layer, to an upper surface of the sacrificial film;
    c) applying irradiating light having a wavelength at which the light passes through the first substrate and is absorbed in the first semiconductor layer, to a surface of the first substrate opposite to the first semiconductor layer, thereby forming a thermal decomposition layer between the first semiconductor layer and the first substrate as a result of thermal decomposition of the first semiconductor layer; and
    d) selectively removing the sacrificial film, thereby peeling off the polymer film from the first semiconductor layer.

24. The method of claim 23, wherein the polymer film is made of polyimide.

25. The method of claim 23, wherein the sacrificial film is either a single-layer film made of a material selected from the group consisting of silicon oxide, silicon nitride and zinc oxide, or a multi-layer film containing at least two of these materials.

26. The method of claim 23, wherein in the step d), the sacrificial film is dissolved with an acid solution.

27. The method of claim 23, wherein the first semiconductor layer includes an active layer.

28. The method of claim 23, including, between the steps c) and d), the steps of:
    e) selectively removing the thermal decomposition layer, thereby separating the first substrate from the first semiconductor layer; and
    f) bonding a second substrate made of a material different from that of the first substrate, to a surface of the first semiconductor layer from which the first substrate has been separated.

29. The method of claim 28, wherein the step f) includes the step of interposing a metal film between the second substrate and the first semiconductor layer.

30. The method of claim 29, wherein the metal film contains indium or tin.

31. The method of claim 28, including the step g) of cleaving the second substrate and the first semiconductor layer using a plane in the second substrate along which cleavage is performed easily, after the step f) has been performed.

32. The method of claim 23, including the step h) of growing a second semiconductor layer on the first semiconductor layer, after the step d) has been performed.

33. The method of claim 32, wherein the second semiconductor layer includes an active layer.

34. The method of claim 32, including the steps of:
 i) selectively removing the thermal decomposition layer, thereby separating the first substrate from the first semiconductor layer; and
 j) bonding a second substrate made of a material different from that of the first substrate, to a surface of the first semiconductor layer from which the first substrate has been separated,
after the step h) has been performed.

35. The method of claim 34, wherein the step j) includes the step of interposing a metal film between the second substrate and the first semiconductor layer.

36. The method of claim 35, wherein the metal film contains indium or tin.

37. The method of claim 34, including the step k) of cleaving the second substrate, the first semiconductor layer and the second semiconductor layer using a plane in the second substrate along which cleavage is performed easily, after the step j) has been performed.

38. The method of claim 34, wherein the second substrate is made of a material selected from the group consisting of silicon, gallium arsenide, gallium phosphide, indium phosphide, silicon carbide and metal.

39. The method of claim 32, wherein the second semiconductor layer is made of a compound semiconductor containing nitrogen.

40. The method of claim 23, wherein the first semiconductor layer is made of a compound semiconductor containing nitrogen.

41. The method of claim 23, wherein the first substrate is made of a material selected from the group consisting of sapphire, magnesium oxide and lithium gallium aluminum oxide ($LiGa_xAl_{1-x}O_2$ where $0 \leq x \leq 1$).

42. The method of claim 23, wherein the irradiating light is a pulsing laser light beam.

43. The method of claim 23, wherein the irradiating light is an emission line of a mercury lamp.

44. The method of claim 23, wherein the irradiating light is applied such that the first substrate is scanned within the surface area of the first substrate.

45. The method of claim 23, wherein the irradiating light is applied while the first substrate is heated.

46. The method of claim 23, wherein the first substrate is heated at a temperature at which the polymer film or the adhesive layer does not change in quality.

* * * * *